US010601340B2

(12) United States Patent
Dorn et al.

(10) Patent No.: US 10,601,340 B2
(45) Date of Patent: Mar. 24, 2020

(54) SUBMODULE AND ELECTRICAL ARRANGEMENT HAVING SUBMODULES

(71) Applicant: SIEMENS Aktiengesellschaft, Munich (DE)

(72) Inventors: Joerg Dorn, Buttenheim (DE); Daniel Schmitt, Postbauer-Heng (DE); Frank Schremmer, Fuerth (DE); Marcus Wahle, Veitsbronn (DE); Felix Hacker, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 16/178,804

(22) Filed: Nov. 2, 2018

(65) Prior Publication Data
US 2019/0131885 A1 May 2, 2019

(30) Foreign Application Priority Data
Nov. 2, 2017 (DE) .................. 10 2017 219 499

(51) Int. Cl.
*H02M 1/32* (2007.01)
*H02H 7/12* (2006.01)
(Continued)

(52) U.S. Cl.
CPC ............. *H02M 7/483* (2013.01); *H02M 1/32* (2013.01); *H02M 7/521* (2013.01);
(Continued)

(58) Field of Classification Search
CPC .... H02M 1/32; H02M 2001/322; H02M 7/02; H02M 7/42; H02M 7/53846;
(Continued)

(56) References Cited

U.S. PATENT DOCUMENTS 3,967,138 A 6/1976 Mitsuoka et al.
5,998,812 A 12/1999 Bernier et al.
(Continued)

FOREIGN PATENT DOCUMENTS

CN 102801295 A 11/2012
DE 69426319 T2 3/2001
(Continued)

OTHER PUBLICATIONS

Marquardt R.; "Modular Multilevel Converter: An universal concept for HVDC-Networks and extended DC-Bus-applications"; The 2010 Inernational Power Electronics Conference, (IPEC); pp. 502-507; DOI: 10.109/IPEC.2010.5544594; XP031729731; 2010.

*Primary Examiner* — Gary L Laxton
(74) *Attorney, Agent, or Firm* — Laurence Greenberg; Werner Stemer; Ralph Locher

(57) ABSTRACT

An electrical configuration contains at least one submodule which has a first and a second outer electrical terminal. The configuration further has a bypass switching device, which is electrically connected between the first and second terminals and in the on-state causes an electrical short-circuit in at least one current flow direction between the two outer terminals. The bypass switching device has a thyristor with an anode terminal, a cathode terminal and a trigger terminal and is connected by its anode terminal to one of the two outer terminals and by its cathode terminal to the other of the two outer terminals. A triggering device is connected to the trigger terminal of the thyristor for triggering the thyristor, and a switch is provided which in the on-state connects the anode terminal of the thyristor to the trigger terminal of the thyristor.

5 Claims, 4 Drawing Sheets

(51) Int. Cl.
*H02M 7/483* (2007.01)
*H02M 7/521* (2006.01)
*H03K 17/735* (2006.01)
*H02H 7/122* (2006.01)
*H02H 7/125* (2006.01)
*H02M 1/06* (2006.01)
*H01L 29/74* (2006.01)

(52) U.S. Cl.
CPC ........ *H03K 17/735* (2013.01); *H01L 29/7408* (2013.01); *H02M 1/06* (2013.01); *H02M 2001/325* (2013.01); *H02M 2007/4835* (2013.01)

(58) Field of Classification Search
CPC ...... H02M 7/5387; H02M 7/162; H02H 7/12; H02H 7/122; H02H 7/1225; H02H 7/125; H02H 7/1255
See application file for complete search history.

(56) References Cited

U.S. PATENT DOCUMENTS

| | | | |
|---|---|---|---|
| 6,373,731 B1 * | 4/2002 | Iwamura | H02M 1/34 361/91.1 |
| 9,438,136 B2 * | 9/2016 | Kim | H02M 7/483 |
| 2008/0232145 A1 | 9/2008 | Hiller et al. | |
| 2011/0235221 A1 | 9/2011 | Voegeli | |

FOREIGN PATENT DOCUMENTS

| | | |
|---|---|---|
| DE | 102005040543 A1 | 3/2007 |
| EP | 2369725 A1 | 9/2011 |
| JP | S5558773 A | 5/1980 |
| KR | 101780265 B1 | 9/2017 |
| WO | 2013044961 A1 | 4/2013 |

* cited by examiner

SUBMODULE AND ELECTRICAL ARRANGEMENT HAVING SUBMODULES

CROSS-REFERENCE TO RELATED APPLICATION

This application claims the priority, under 35 U.S.C. § 119, of German application DE 10 2017 219 499.5, filed Nov. 2, 2017; the prior application is herewith incorporated by reference in its entirety.

BACKGROUND OF THE INVENTION

Field of the Invention

The invention relates to an electrical arrangement having at least one submodule, which has a first and a second outer electrical terminal. Such arrangements are known for example from the field of converter technology, particularly the field of modular multilevel converters.

A modular multilevel converter is described for example in the document "Modular Multilevel Converter: An universal concept for HVDC-Networks and extended DC-Bus-Applications" (R. Marquardt, 2010 International Power Electronics Conference, pages 502 to 507, 978-1-4244-5393-1/10, 2010 IEEE). The document discloses submodules which contain half-bridges and full-bridges.

SUMMARY OF THE INVENTION

The object of the invention is to provide an electrical arrangement having at least one submodule, in which rapid short-circuiting of the outer terminals of the submodule—in at least one current direction—can be achieved in a straightforward way.

This object is achieved according to the invention by an arrangement having the features according to the main patent claim. Advantageous configurations of the arrangement according to the invention are specified in the dependent claims.

Accordingly, the invention proposes that the arrangement has at least one bypass switching device, which is electrically connected between the first and second terminals of the submodule and in the on-state causes an electrical short-circuit in at least one current flow direction between the two outer terminals of the submodule. The bypass switching device has:
a) a thyristor, which has an anode terminal, a cathode terminal and a trigger terminal and is connected by its anode terminal to one of the two outer terminals of the submodule and by its cathode terminal to the other of the two outer terminals of the submodule,
b) a triggering device, connected to the trigger terminal of the thyristor, for triggering the thyristor, and
c) a switch, which in the on-state connects the anode terminal of the thyristor to the trigger terminal of the thyristor.

One essential advantage of the arrangement according to the invention is that, owing to the bypass switching device provided according to the invention, which is based on a thyristor that can be switched through, very rapid creation of a short-circuit (in the current flow direction of the switched-through thyristor) between the two terminals of the submodule is possible even without using pyrotechnic material. The high switching speed (about 10 µs) can be achieved because the thyristor can be switched on in two stages: in the first phase, the switching on is based on the triggering device, which actively causes a triggering of the thyristor in the presence of a bypass activation signal. The switch between the anode terminal of the thyristor and the triggering terminal can be switched on during the active triggering of the thyristor—relatively slowly with a switching speed in the single-figure millisecond range—so that a second triggering path for permanent triggering of the thyristor is activated, which leaves the thyristor in the on-state even after the triggering device is switched off—i.e. in a second phase. The bypass switching device according to the invention is thus rapid because of the active triggering of the thyristor, and is switched into permanent diode operation by the switch, which may operate relatively slowly.

It is advantageous that the electrical arrangement has a control device, which in the presence of a bypass activation signal activates the triggering device with a triggering signal and closes the switch.

The control device is preferably configured in such a way that it applies the triggering signal for activating the triggering device and for triggering the thyristor to the trigger terminal at least until the switch has reached its on-state.

The triggering device is preferably electrically connected between the trigger terminal and the cathode terminal of the thyristor.

With respect to the submodule, it is regarded as advantageous, particularly with a view to use in a converter, for example a multilevel converter, that the submodule has a switching element, in particular a transistor, between the first and second terminals, and a freewheel diode, which is connected in parallel therewith, whose cathode terminal is connected to the first terminal of the submodule and whose anode terminal is connected to the second terminal of the submodule.

With respect to the interconnection of the components, it is regarded as advantageous that the anode terminal of the thyristor is connected to the first terminal of the submodule, the cathode terminal of the thyristor is connected to the second terminal of the submodule, the switch in the on-state connects the anode terminal of the thyristor, and therefore the first terminal of the submodule, to the trigger terminal of the thyristor, and the triggering device is electrically connected between the trigger terminal of the thyristor and the second terminal of the submodule.

In order to be able to conduct a short-circuit current bidirectionally past the submodule, it is regarded as advantageous that, in addition to the aforementioned thyristor, referred to below as the first thyristor, the bypass switching device has a further thyristor, referred to below as the second thyristor, and in addition to the aforementioned switch, referred to below as the first switch, a further switch, referred to below as the second switch. The second thyristor is connected by its anode terminal to the second terminal of the submodule and by its cathode terminal to the first terminal of the submodule, and the second switch in the on-state connects the anode terminal of the second thyristor, and therefore the second terminal of the submodule, to the trigger terminal of the second thyristor.

The latter variant is furthermore advantageous when, in addition to the aforementioned triggering device, referred to below as the first triggering device, the bypass switching device has a further triggering device, referred to below as the second triggering device, the first triggering device is electrically connected between the trigger terminal of the first thyristor and the second terminal of the submodule, and the second triggering device is electrically connected between the trigger terminal of the second thyristor and the first terminal of the submodule.

The submodule is preferably a half-bridge module or a full-bridge module, or is preferably formed by a series circuit of half-bridge modules and/or full-bridge modules.

With a view to use of the arrangement in a converter, for example a multilevel converter, or a reactive power controller, it is regarded as advantageous that the arrangement has two or more submodules, which are electrically connected in series to form a submodule series circuit and respectively comprise a first and second outer electrical terminal, the electrically inner-lying submodules of the submodule series circuit being connected by their first terminal to a second terminal of a submodule, lying at a higher potential, of the submodule series circuit and by their second terminal to a first terminal of a submodule, lying at a lower potential, of the submodule series circuit.

Each submodule is preferably respectively provided with its own bypass switching device.

It is advantageous if—as mentioned—the electrical arrangement forms a modular multilevel converter having at least one submodule series circuit, which contains at least two submodules connected in series and an inductor.

The invention furthermore relates to a submodule having a first and a second outer electrical terminal for an electrical arrangement, as has been described above, that is to say in particular for a converter, a multilevel converter or a reactive power controller.

With respect to such a submodule, the invention proposes that the submodule has at least one bypass switching device, which is electrically connected between the first and second terminals of the submodule and in the on-state causes an electrical short-circuit between the two outer terminals of the submodule. The bypass switching device having:
a) a thyristor, which has an anode terminal, a cathode terminal and a trigger terminal and is connected by its anode terminal to one of the two outer terminals of the submodule and by its cathode terminal to the other of the two outer terminals of the submodule,
b) a triggering device, connected to the trigger terminal of the thyristor, for triggering the thyristor, and
c) a switch, which in the on-state connects the anode terminal of the thyristor to the trigger terminal of the thyristor.

With respect to the advantages of the submodule according to the invention, reference is made to the comments above relating to the arrangement according to the invention.

The following are preferably connected between the first and second terminals of the submodule:
a) a first switching element, in particular a first transistor,
b) a freewheel diode, which is connected in parallel therewith, whose cathode terminal is connected to the first terminal of the submodule and whose anode terminal is connected to the second terminal of the submodule, and
c) a series circuit consisting of a second switching element, in parallel with which a second freewheel diode is connected, and an energy storage unit, in particular a capacitor.

It is also advantageous that, in addition to the aforementioned thyristor, referred to below as the first thyristor, the bypass switching device has a further thyristor, referred to below as the second thyristor, in addition to the aforementioned switch, referred to below as the first switch, a further switch, referred to below as the second switch, and in addition to the aforementioned triggering device, referred to below as the first triggering device, a further triggering device, referred to below as the second triggering device. The first thyristor is connected by its anode terminal to the first terminal of the submodule and by its cathode terminal to the second terminal of the submodule, the first switch in the on-state connects the anode terminal of the first thyristor, and therefore the first terminal of the submodule, to the trigger terminal of the first thyristor. The second thyristor is connected by its anode terminal to the second terminal of the submodule and by its cathode terminal to the first terminal of the submodule. The second switch in the on-state connects the anode terminal of the second thyristor, and therefore the second terminal of the submodule, to the trigger terminal of the second thyristor, the first triggering device is electrically connected between the trigger terminal of the first thyristor and the second terminal of the submodule. The second triggering device is electrically connected between the trigger terminal of the second thyristor and the first terminal of the submodule. The electrical arrangement has one or more control devices, which in the presence of a bypass activation signal activate the first and second triggering devices with a triggering signal and close the first and second switches. The control device or the control devices are configured in such a way that they apply the triggering signals for triggering the thyristors to the trigger terminal at least until the first and second switches have reached their on-state.

Other features which are considered as characteristic for the invention are set forth in the appended claims.

Although the invention is illustrated and described herein as embodied in an electrical arrangement having submodules and submodules per se, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL
VIEWS OF THE DRAWING

DETAILED DESCRIPTION OF THE INVENTION

In the figures, for the sake of clarity, the same references are always used for identical or comparable components.

Figure 1:
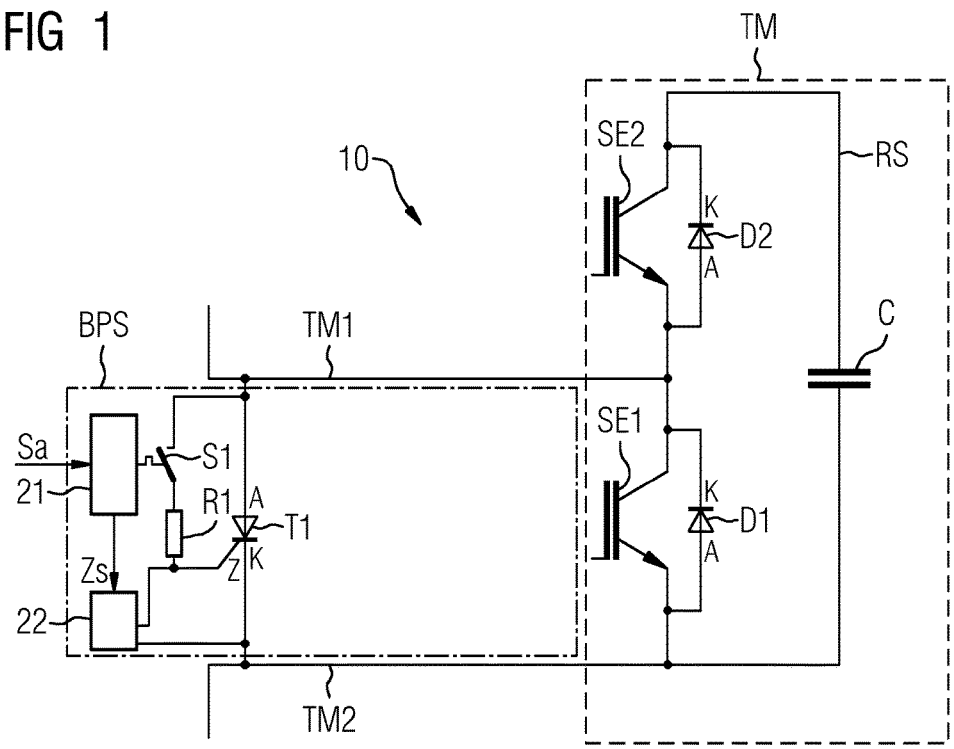
FIG. 1 is an illustration showing an exemplary embodiment of an arrangement having a submodule and a bypass switching device connected in parallel therewith, which operates unidirectionally and can unidirectionally form a short-circuit.

Referring now to the figures of the drawings in detail and first, particularly to FIG. 1 thereof, there is shown an exemplary embodiment of an electrical arrangement 10, which has a submodule TM.

The submodule TM contains a first switching element SE1, particularly in the form of a transistor, which is electrically connected between a first terminal TM1 and a second terminal TM2 of the submodule TM. In parallel with the first switching element SE1, there is a first freewheel diode D1 whose cathode terminal K is connected to the first terminal TM1 of the submodule TM and whose anode terminal A is connected to the second terminal TM2 of the submodule TM.

Connected between the two terminals TM1 and TM2 of the submodule TM, there is furthermore a series circuit RS which contains a second switching element SE2, particularly in the form of a second transistor, as well as a second freewheel diode D2 connected in parallel therewith and an energy storage unit in the form of a capacitor C. The anode terminal A of the second freewheel diode D2 is connected to the first terminal TM1 of the submodule TM; the cathode terminal K of the second freewheel diode D2 is connected to the capacitor C.

The described components of the submodule TM electrically form a half-bridge module. As an alternative, the submodule TM may also electrically form a full-bridge module or be formed from a series circuit of half-bridge modules, as shown in FIG. 1, and/or full-bridge modules.

Electrically connected between the first terminal TM1 and the second terminal TM2 of the submodule TM, there is a bypass switching device BPS which operates unidirectionally and, in the on-state, can cause an electrical short-circuit between the two terminals TM1 and TM2 in the current flow direction from the first terminal TM1 to the second terminal TM2.

The bypass switching device BPS has a thyristor T1, whose anode terminal A is connected to the first terminal TM1 of the submodule TM and whose cathode terminal K is connected to the second terminal TM2 of the submodule TM. The trigger terminal Z of the thyristor T1 is connected via a resistor R1 and an electrical switch S1 to the first terminal TM1 of the submodule TM, and therefore to the anode terminal A of the thyristor T1.

The driving of the switch S1, or the opening and closing of the switch S1, is carried out by a control device 21, to which a bypass activation signal Sa can be applied on the input side.

The control device 21 is furthermore connected to a triggering device 22, which is connected to the trigger terminal Z of the thyristor T1 and to the cathode terminal of the thyristor T1, and therefore to the second terminal TM2 of the submodule TM.

The arrangement 10, or the bypass switching device BPS, may be operated as now described.

If, in the event of a fault of the arrangement 10, and particularly in the event of a fault of the submodule TM, a short-circuit is produced between the first terminal TM1 and the second terminal TM2 for a current flow from the first terminal TM1 in the direction of the second terminal T2, the bypass activation signal Sa is applied to the control device 21. In the presence of the bypass activation signal Sa, the control device 21 activates the triggering device 22, which thereupon feeds a triggering current for triggering the thyristor T1 into the trigger terminal Z. Suitable triggering devices 22 for triggering the thyristor T1 may, for example, be found from the document "Technical Information, Bipolar Semiconductors" (Infineon Technologies Bipolar GmbH & Co. KG, Max-Planck-Str. 5, 59581 Warstein; Order Number: B157-H9716-X-X-7600, April 2012).

Furthermore, the control device 21 produces a switching signal for switching on the switch S1. The control device 21 is in this case configured in such a way that it produces the triggering signal Zs for activating the triggering device 22, and therefore for triggering the thyristor T1, at least until the thyristor T1 is supplied with a triggering current, and remains triggered, at least until the switch S1 has reached its on-state. These measures ensure that, after input of the bypass activation signal Sa, the thyristor T1 is triggered by the triggering device 22, and therefore remains switched on, at least until the switch S1 is closed and thus the alternative path, formed by the switch S1 and the resistor R1, for triggering the thyristor T1 is activated.

In other words, the series circuit of the switch S1 and the resistor R1, between the trigger terminal Z of the thyristor T1 and the anode terminal A of the thyristor T1, is used to form an alternative triggering device which, after the switch S1 is switched on, permanently causes triggering of the thyristor T1 and therefore permanently assures the on-state of the thyristor T1. With the switching-on of the switch S1, the thyristor T1 electrically becomes a diode which can constantly carry current in a current direction from the anode A to the cathode K.

Figure 2:
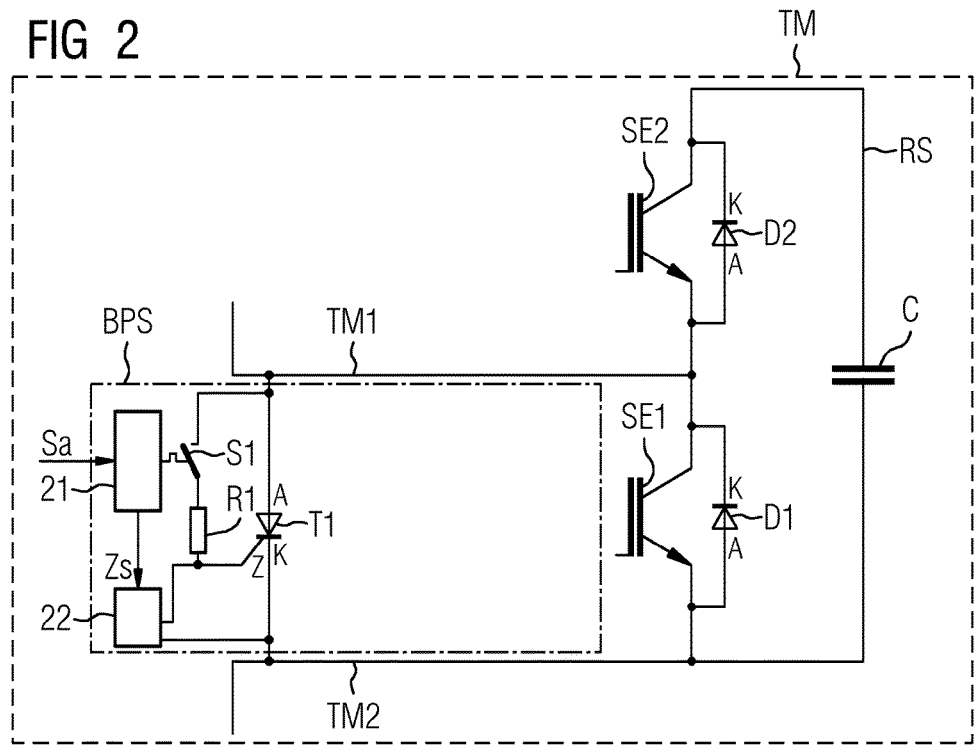
FIG. 2 is an illustration showing an exemplary embodiment of a submodule according to the invention, in which the bypass switching device shown in FIG. 1 forms a submodule-internal component part of the submodule.

FIG. 2 shows an exemplary embodiment of a submodule TM which contains the half-bridge module, described in connection with FIG. 1, formed by the two switching elements SE1 and SE2, the two freewheel diodes D1 and D2, and the capacitor C, and furthermore the bypass switching device BPS according to FIG. 1. In contrast to the exemplary embodiment according to FIG. 1, the bypass switching device BPS is therefore a component part of the submodule TM. In other regards, the comments above in connection with FIG. 1 apply accordingly.

Figure 3:
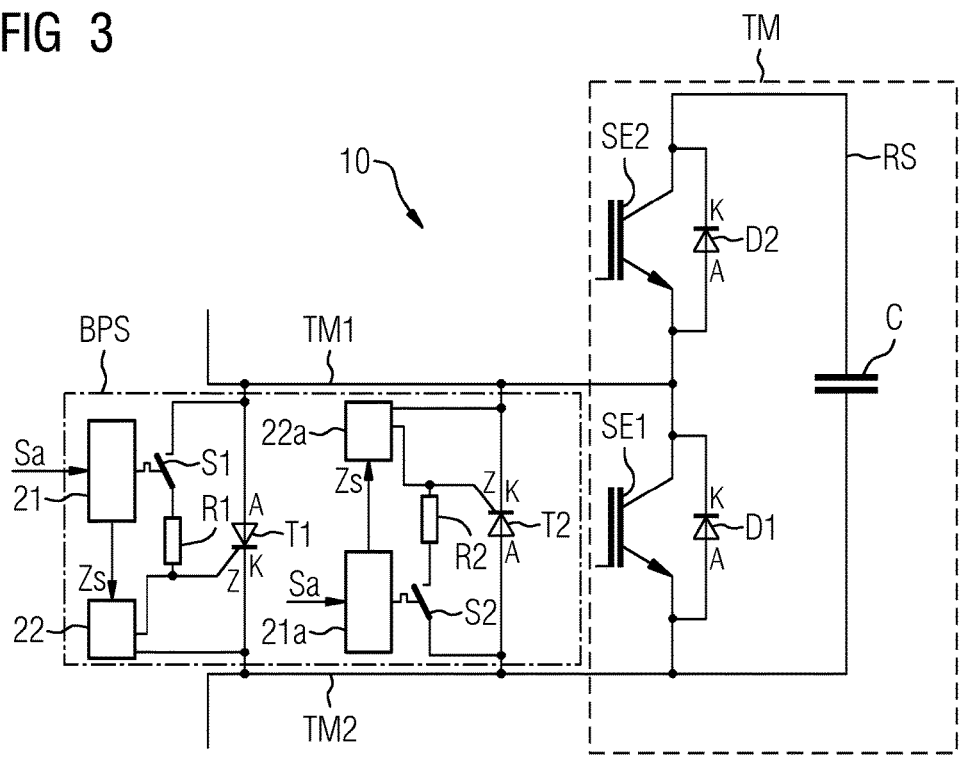
FIG. 3 is an illustration showing an exemplary embodiment of an arrangement having a submodule and a bypass switching device connected in parallel therewith, which operates bidirectionally and can bidirectionally form an electrical short-circuit.

FIG. 3 shows an exemplary embodiment of an electrical arrangement 10 which has the submodule TM, already described in connection with FIG. 1, as well as a bypass switching device BPS connected between the two terminals TM1 and TM2 of the submodule TM.

The bypass switching device BPS according to FIG. 3 contains, on the left-hand side of the illustration in FIG. 3, the components described in connection with FIG. 1, i.e. the control device 21, the triggering device 22, the switch S1, the resistor R1 and the thyristor T1. These components are used to switch the thyristor T1 on when the bypass activation signal Sa is applied, in order to cause a short-circuit for the current direction from the first terminal TM1 to the second terminal TM2 of the submodule TM.

So that a short-circuit current can also be conducted past the submodule TM from the second terminal TM2 in the direction of the first terminal T1, for example in order to electrically relieve the freewheel diode D1 or avoid an overload of this freewheel diode D1, in the exemplary embodiment according to FIG. 3 the bypass switching device BPS additionally has a short-circuit path for the other current direction. This short-circuit path contains a second thyristor T2, whose anode terminal A is connected to the second terminal TM2 of the submodule TM, and therefore to the cathode terminal K of the thyristor T1, referred to below as the first thyristor. The cathode terminal K of the second thyristor T2 is connected to the first terminal TM1 of the submodule TM and therefore to the anode terminal A of the first thyristor T1.

In order to trigger the second thyristor T2, a second triggering device 22a is provided, which is electrically connected between the trigger terminal Z of the second thyristor T2 and the first terminal TM1 of the submodule TM.

In order, after triggering of the second thyristor T2, to be able to ensure the on-state of the thyristor T2 permanently an alternative triggering path is connected between the trigger terminal Z of the second thyristor T2 and the anode terminal A of the second thyristor T2, this path being formed by a series circuit of a second resistor R2 and a second switch S2. The driving of the second triggering device 22a and of the second switch S2 is carried out by a second control device 21a in the exemplary embodiment according to FIG. 3.

The arrangement 10 according to FIG. 3 preferably operates as now described.

When a bypass activation signal Sa is applied to the control device 21 and the second control device 21a, the first control device 21 switches through the first thyristor T1, as has already been explained in connection with FIG. 1. In this regard, reference is made to the comments above.

The second triggering device 22a will in a corresponding way trigger the second control device 21a by means of a trigger signal Zs, so that the second thyristor T2 is likewise switched through very rapidly. At the same time, the second control device 21a will close the second switch S2 and therefore activate an alternative triggering path for permanent triggering, or for a permanent on-state, of the second thyristor T2. In other words, the second control device 21a and the second triggering device 22a operate in a similar way to the first control device 21 and the first triggering device 22, so that the comments above apply here correspondingly.

In the case of a transient fault, it is advantageous for the second thyristor T2 to be driven, or switched through, only temporarily by means of the second triggering device 22a, i.e. like a conventional thyristor, without permanent activation by the second switch S2.

After the application of a bypass activation signal Sa, the control devices 21 and 21a will thus activate the triggering devices 22 and 22a by means of the triggering signals Zs, so that triggering of the two thyristors T1 and T2 is initiated by them. Furthermore, the switches S1 and S2 are closed, so that for the subsequent operation, even after switching off the triggering devices 22 and 22a, thyristors T1 and T2 remain switched on and respectively assume the function of a diode.

In contrast to the exemplary embodiments according to FIGS. 1 and 2, the bypass switching device BPS according to FIG. 3 therefore operates bidirectionally, since it allows a short-circuit current in both current directions between the two terminals TM1 and TM2 of the submodule TM.

Figure 4:
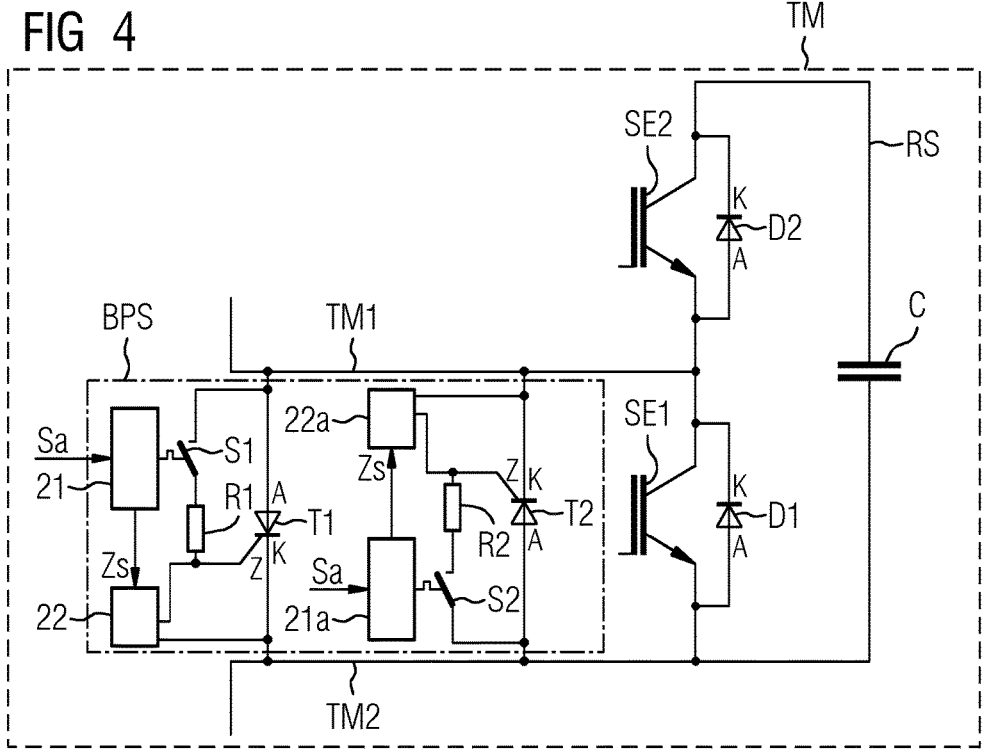
FIG. 4 is an illustration of an exemplary embodiment of a submodule according to the invention, in which the bidirectionally operating bypass switching device shown in FIG. 3 forms a submodule-internal component part of the submodule.

FIG. 4 shows an exemplary embodiment of a submodule TM which has the half-bridge module according to FIG. 1 as well as additionally the bypass switching device BPS according to FIG. 3 as a submodule-internal component part. The submodule TM according to FIG. 4 therefore contains a bidirectional bypass switching device, which after activation can carry a short-circuit current bidirectionally between the two terminals TM1 and TM2, as has already been explained above in connection with FIG. 3.

In connection with FIGS. 3 and 4, it should be mentioned that two control devices 21 and 21a need not necessarily be provided for activation of the triggering devices 22 and 22a and for the switching-on of the two switches S1 and S2—as shown in FIGS. 3 and 4. As an alternative, it is possible both to switch on the switches S1 and S2 and to provide the triggering signals Zs for activation of the two triggering devices 22 and 22a with only a single control device, for example the control device 21. The second control device 21a shown in FIGS. 3 and 4 may then be obviated, or omitted.

Figure 5:
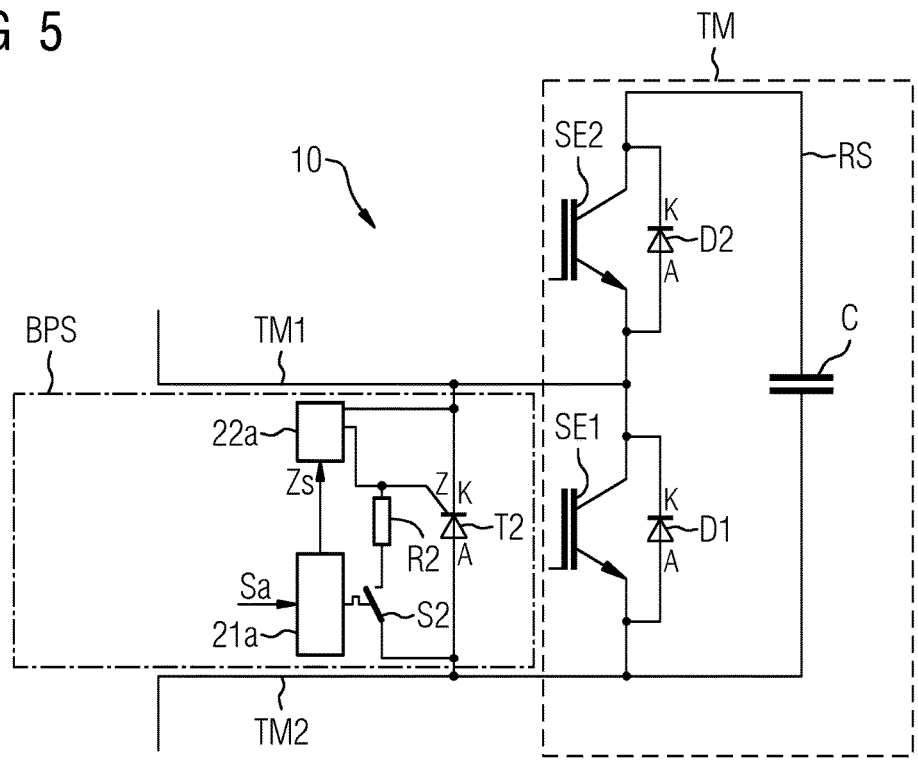
FIG. 5 is an illustration showing an exemplary embodiment of an arrangement having a submodule and a bypass switching device connected in parallel therewith, which operates unidirectionally as in the case of the exemplary embodiments according to FIGS. 1 and 2, but with opposite polarity.

FIG. 5 shows an exemplary embodiment of an arrangement 10 which has a submodule TM in the form of a half-bridge module, as has already been explained in connection with FIG. 1, as well as a bypass switching device BPS connected in parallel therewith.

In the exemplary embodiment according to FIG. 5, the bypass switching device BPS operates unidirectionally and allows a short-circuit current from the second terminal TM2 to the first terminal TM1. To this end, the bypass switching device BPS comprises components already described above in connection with FIGS. 3 and 4 (see the right-hand section of the illustration of the bypass switching device BPS there), namely the second control device 21a, the second triggering device 22a, the second thyristor T2, the second resistor R2 and the second switch S2. As has already been explained in connection with FIGS. 3 and 4, these components are suitable, in the interconnection shown, for conducting a short-circuit current past the submodule TM after triggering of the second thyristor T2, specifically in the current flow direction from the second terminal TM2 to the first terminal TM1 of the submodule TM. In this regard, reference is made to the comments above in connection with FIGS. 3 and 4.

Figure 6:
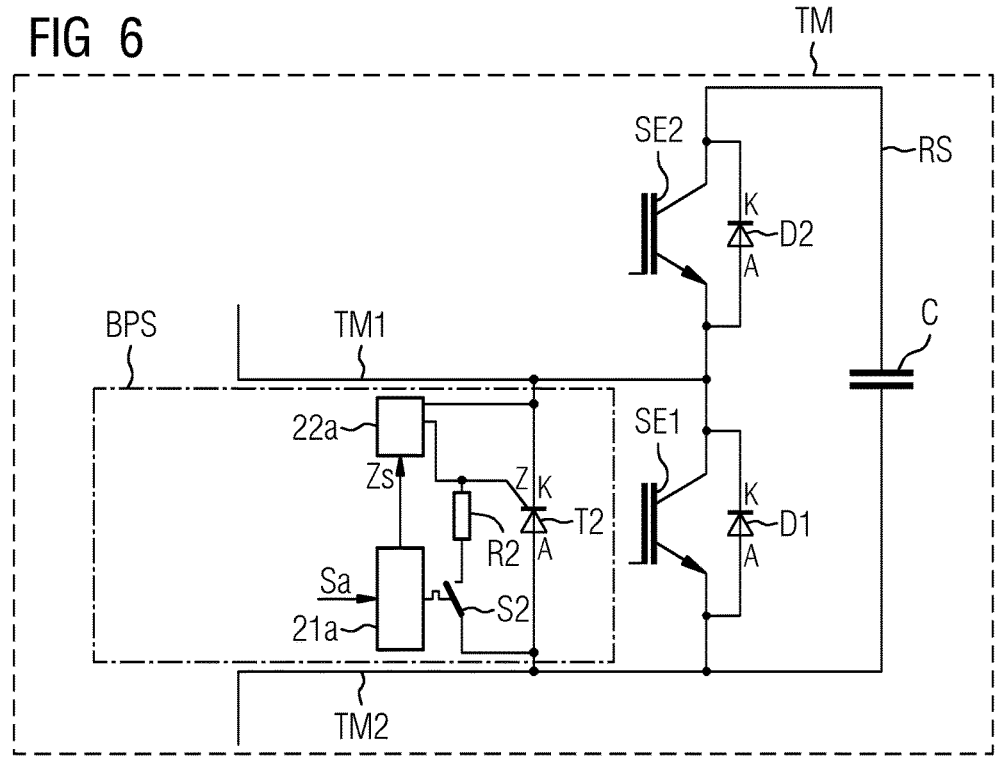
FIG. 6 is an illustration showing an exemplary embodiment of a submodule which has the bypass switching device shown in FIG. 5 as a submodule-internal component part.

FIG. 6 shows an exemplary embodiment of a submodule which has the bypass switching device BPS according to FIG. 5 as a submodule-internal component part. In other regards, the comments above in connection with FIG. 5 apply accordingly.

Figure 7:
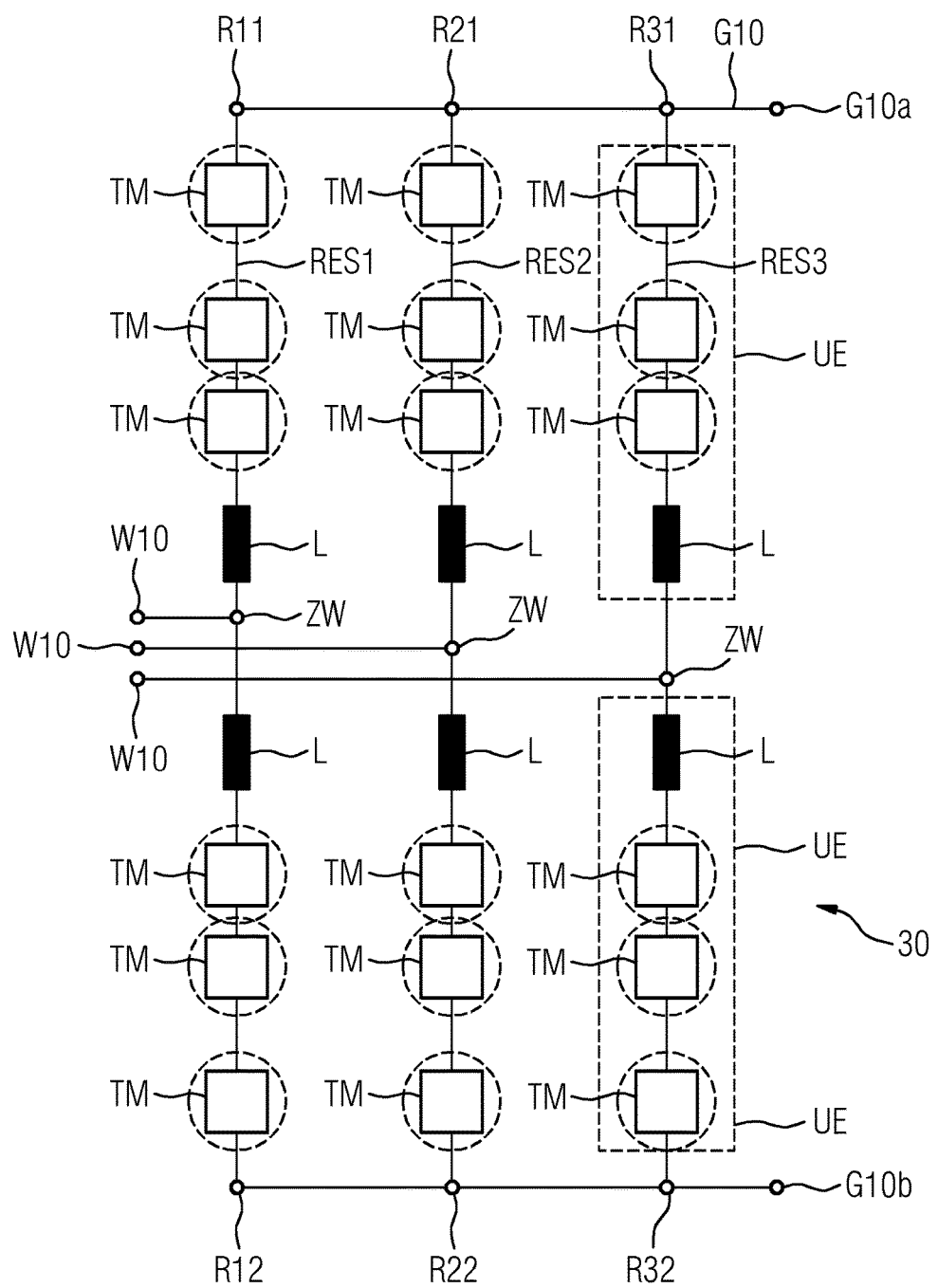
FIG. 7 is an illustration showing an exemplary embodiment of a modular multilevel converter, which has submodules as will be shown and explained by way of example below in connection with FIGS. 1 to 6.

FIG. 7 shows an exemplary embodiment of a three-phase modular multilevel converter 30. This includes AC voltage terminals W10 for feeding or drawing an alternating current. Furthermore, it is equipped with a DC voltage side G10, which contains two DC voltage terminals G10a and G10b, by means of which the direct current can be fed or drawn.

The multilevel converter 30 has three series circuits RES1, RES2 and RES3, which are connected in parallel and whose outer terminals R11, R21 and R31 are connected to the DC voltage terminal G10a. The outer terminals R12, R22 and R32 are connected to the DC voltage terminal G10b of the DC voltage side G10. In other words, the outer terminals of the three series circuits RES1, RES2 and RES3 thus form the DC voltage side G10 of the multilevel converter 30.

Each of the three series circuits RES1, RES2 and RES3 is, for example, respectively equipped with six submodules TM connected in series, and two inductors L. Respectively between the two inductors L, there is an intermediate terminal ZW, the potential of which lies between the upper three submodules in FIG. 1 and the lower three submodules in FIG. 1 and which forms one of the three AC voltage terminals W10 of the multilevel converter 30. By the intermediate terminals ZW, the three series circuits RES1, RES2 and RES3 are respectively subdivided into two subunits, which respectively have a multiplicity of submodules TM connected in series and an inductor L, and therefore respectively per se form a submodule series circuit UE which contains at least two submodules connected in series and an inductor.

Exemplary embodiments of preferred configurations of the submodules TM have been explained in detail above in connection with FIGS. 1 to 6. In this regard, reference is made to the comments above.

Although the invention has been illustrated and described in detail by the preferred exemplary embodiments, the invention is not restricted by the examples disclosed, and other variants may be derived therefrom by a person skilled in the art without departing from the protective scope of the invention.

The following is a summary list of reference numerals and the corresponding structure used in the above description of the invention:
10 arrangement
21 control device
21a control device
22 triggering device
22a triggering device
30 multilevel converter
A anode terminal
BPS bypass switching device
C capacitor
D1 freewheel diode
D2 freewheel diode
G10 DC voltage side
G10a DC voltage terminal
G10b DC voltage terminal
K cathode terminal
L inductor
RS series circuit
R1 resistor
R2 resistor
R11 terminal
R12 terminal
R21 terminal
R22 terminal
R31 terminal
R32 terminal
RES1 series circuit
RES2 series circuit
RES3 series circuit
Sa bypass activation signal
S1 switch
S2 switch
SE1 switching element
SE2 switching element
TM submodule
TM1 first terminal
TM2 second terminal
T1 thyristor
T2 thyristor
UE submodule series circuit
Z trigger terminal
Zs triggering signal
ZW intermediate terminal

The invention claimed is:

1. A submodule for a converter, a multilevel converter, or an electrical configuration, the submodule comprising:
a first outer electrical terminal for an electrical configuration;
a second outer electrical terminal for the electrical configuration;
at least one bypass switching device electrically connected between said first and second outer electrical terminals and in an on-state causes an electrical short-circuit between said first and second outer electrical terminals, said bypass switching device containing:
a first thyristor having an anode terminal, a cathode terminal and a trigger terminal and is connected by said anode terminal to said first outer electrical terminal and by said cathode terminal to said second outer electrical terminal;
a second thyristor having an anode terminal connected to said second outer electrical terminal, a cathode terminal connected to said first outer electrical terminal and trigger terminal;
a first triggering device, connected to said trigger terminal of said first thyristor, for triggering said first thyristor, wherein said first triggering device is electrically connected between said trigger terminal of said first thyristor and said second outer electrical terminal;
a first switch, which in an on-state connects said anode terminal of said first thyristor to said trigger terminal of said first thyristor, and therefore said first outer electrical terminal, to said trigger terminal of said first thyristor;
a second switch, said second switch in an on-state connects said anode terminal of said second thyristor, and therefore said second outer electrical terminal, to said trigger terminal of said second thyristor;
a second triggering device electrically connected between said trigger terminal of said second thyristor and said first outer electrical terminal:
at least one control device, which in a presence of a bypass activation signal activates said first and second triggering devices with a triggering signal and closes said first and second switches; and
said at least one control device is configured in such a way that said control device applies triggering signals for triggering said first and second thyristors to said trigger terminal at least until said first and second switches have reached the on-state.

2. The submodule according to claim 1, further comprising:
a first switching element connected between said first and second outer electrical terminals;
a first freewheel diode connected in parallel with said first switching element and having a cathode terminal connected to said first outer electrical terminal and an anode terminal connected to said second outer electrical terminal;
a second switching element connected between said first and second outer electrical terminals;
a second freewheel diode connected in parallel with said second switching element; and
a series circuit having said first and second switching elements and an energy storage unit.

3. The submodule according to claim 2, wherein:
said first switching element is a first transistor; and
said energy storage unit is a capacitor.

4. The submodule according to claim 1, wherein the submodule is a half-bridge module, a full-bridge module, or is formed by a series circuit of half-bridge modules and/or full-bridge modules.

5. A configuration, comprising:

a plurality of submodules which are electrically connected in series to form a submodule series circuit and respectively each of said submodules containing:
- a first outer electrical terminal for an electrical configuration;
- a second outer electrical terminal for the electrical configuration;
- at least one bypass switching device electrically connected between said first and second outer electrical terminals and in an on-state causes an electrical short-circuit between said first and second outer electrical terminals, said bypass switching device containing:
  - a first thyristor having an anode terminal, a cathode terminal and a trigger terminal and is connected by said anode terminal to said first outer electrical terminal and by said cathode terminal to said second outer electrical terminal;
  - a second thyristor having an anode terminal connected to said second outer electrical terminal, a cathode terminal connected to said first outer electrical terminal and a trigger terminal;
  - a first triggering device, connected to said trigger terminal of said first thyristor, for triggering said first thyristor, wherein said first triggering device is electrically connected between said trigger terminal of said first thyristor and said second outer electrical terminal;
  - a first switch, which in an on-state connects said anode terminal of said first thyristor to said trigger terminal of said first thyristor, said first switch in the on-state connects said anode terminal of said first thyristor, and therefore said first outer electrical terminal, to said trigger terminal of said first thyristor;
  - a second switch, said second switch in an on-state connects said anode terminal of said second thyristor, and therefore said second outer electrical terminal, to said trigger terminal of said second thyristor;
  - a second triggering device electrically connected between said trigger terminal of said second thyristor and said first outer electrical terminal;
  - at least one control device, which in a presence of a bypass activation signal activates said first and second triggering devices with a triggering signal and closes said first and second switches; and
  - said at least one control device is configured in such a way that said control device applies triggering signals for triggering said first and second thyristors to said trigger terminal at least until said first and second switches have reached the on-state; and an electrically inner-lying submodule of said submodule series circuit being connected by said first outer electrical terminal to said second outer electrical terminal of said submodule, lying at a higher potential, of said submodule series circuit and by said second outer electrical terminal to said first outer electrical terminal of said submodule, lying at a lower potential, of said submodule series circuit.

* * * * *